United States Patent [19]

Honorof et al.

[11] Patent Number: 4,797,773
[45] Date of Patent: Jan. 10, 1989

[54] SPATIAL ARRAY FILTERING SYSTEM FOR ELECTRICAL DEVICES

[75] Inventors: Frank D. Honorof, Priest River; Richard Odenberg, Coeur d'Alene, both of Id.

[73] Assignee: Transtector Systems, Inc., Hayden Lake, Id.

[21] Appl. No.: 183,383

[22] Filed: Apr. 13, 1988

Related U.S. Application Data

[63] Continuation of Ser. No. 861,321, May 9, 1986, abandoned.

[51] Int. Cl.4 .............................................. H02H 9/00
[52] U.S. Cl. ...................................... 361/58; 361/111; 361/113; 307/318
[58] Field of Search ........................ 361/58, 91, 88, 93, 361/111, 113; 307/318, 303; 357/76; 333/172

[56] References Cited

U.S. PATENT DOCUMENTS

| | | | |
|---|---|---|---|
| 3,267,292 | 8/1966 | Dunnet et al. | 307/88.5 |
| 3,573,550 | 4/1971 | Baker, Jr. | 361/56 |
| 3,999,205 | 12/1976 | Stewart | 361/111 X |

Primary Examiner—A. D. Pellinen
Assistant Examiner—Todd E. DeBoer
Attorney, Agent, or Firm—Fulwider, Patton, Rieber, Lee & Utecht

[57] ABSTRACT

A method and apparatus for protecting electrical circuits by suppressing voltage and/or current transients while simultaneously filtering unwanted noise, such as electromagnetic interference (EMI), at specially selected frequencies, by controlling the spatial array of devices in an electronic package to tailor the impedance versus frequency characteristics of the overall package.

11 Claims, 2 Drawing Sheets

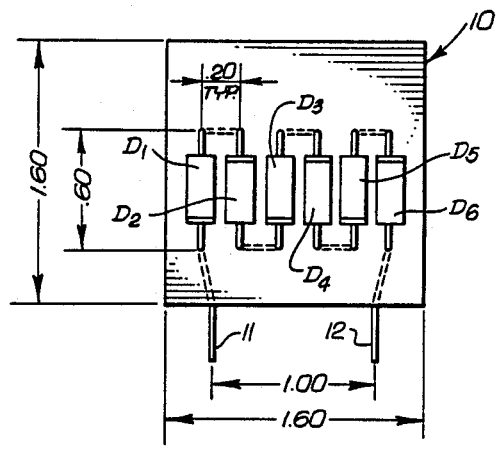
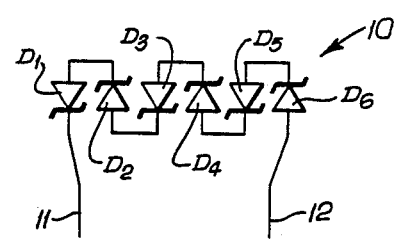
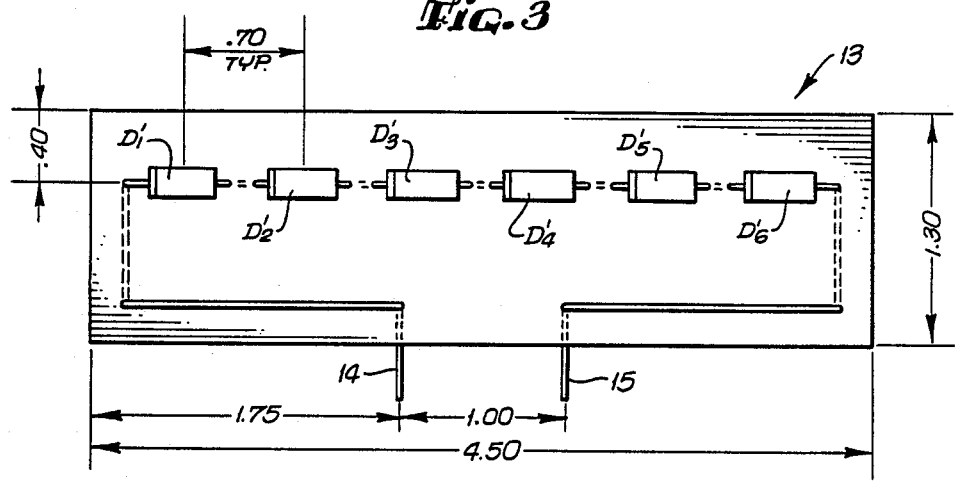
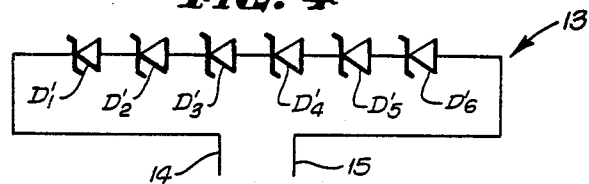

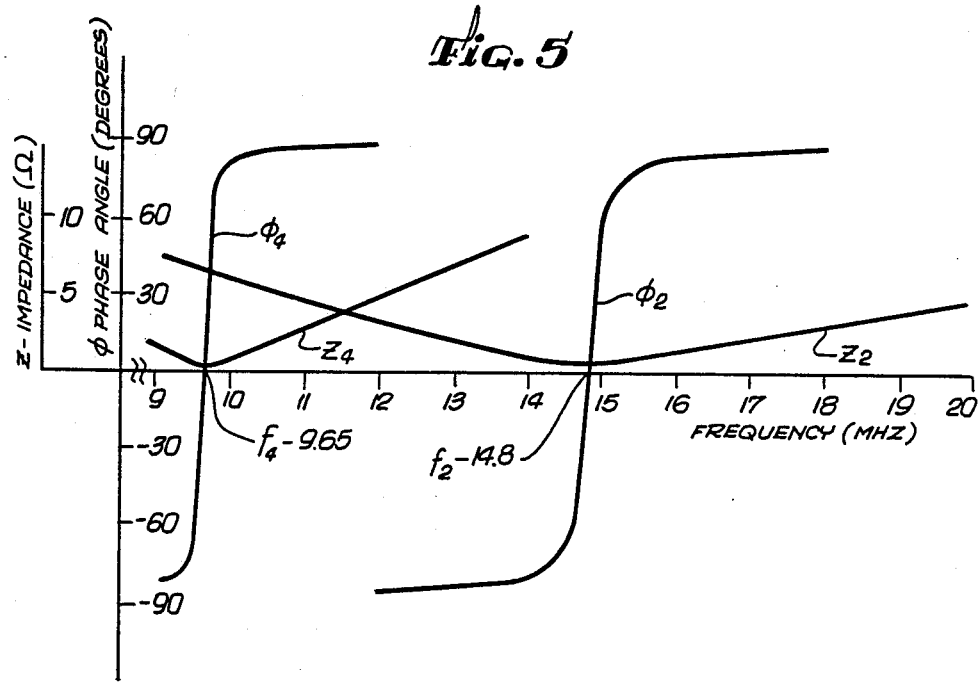
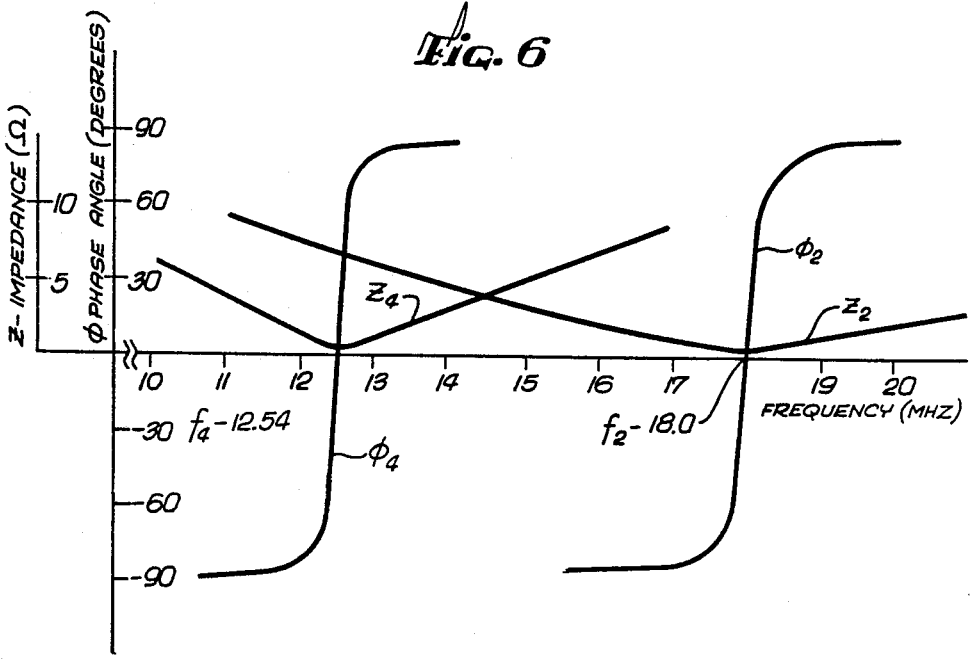

SPATIAL ARRAY FILTERING SYSTEM FOR ELECTRICAL DEVICES

This application is a continuation of application Ser. No. 861,321, filed May 9, 1986 now abandoned.

BACKGROUND OF THE INVENTION

This invention relates generally to improvements in methods and apparatus for filtering out noise, such as electromagnetic interference and, more particularly, to a new and improved system for tailoring the noise suppression characteristics of electronic packages, such as voltage and/or current transient protection devices and the like.

A good deal of modern electrical systems, and especially computers and other circuits employing semiconductor devices, have operating characteristics which render such electrical systems relatively vulnerable to the deleterious effects of electrical transients. For this reason, it has become a common practice in the electrical arts to utilize a transient voltage and/or current protection device to minimize the risks associated with such undesired electrical transients.

While the use of transient protection devices is now commonplace, a new villian has arisen to further complicate matters in terms of interfering with the operation of sensitive equipment such as computers and the like. This problem concerns undesirable electrical noise and typically involves electromagnetic interference commonly referred to as EMI. In this regard, the suppression of electrical transients does not necessarily provide any noise suppression and, at best, any noise suppression that may occur would be rather haphazard and totally unrelated to the actual noise spectrum which should be suppressed in any given situation. Indeed, such noise suppression problems may be encountered not only with transient protection devices, but with other electrical packages as well.

Hence, those concerned with the development and use of electrical packages, including transient protection devices, have long recognized the need for improved methods and apparatus for noise suppression and, more particularly, for selectively tailoring the noise suppression characteristics of electronic packages to suit specific applications. The present invention clearly fulfills this need.

SUMMARY OF THE INVENTION

Briefly, and in general terms, the present invention provides a new and improved method and apparatus for providing electrical packages with enhanced and selective noise suppression capability. This is accomplished, in accordance with the invention, by spatially orienting the internal components of an electrical package to provide a selectively tailored impedance vs. frequency characteristic enabling filtering of unwanted noise at frequencies that can be specially selected for each individual application utilizing the electrical package.

Basically, the present invention is directed to an improved electronic method and apparatus for adjusting the lumped parameters of the electrical package, i.e., capacitance and inductance, so that undesired noise frequencies are eliminated from the system. In this regard, the components of the electrical package, be it a transient protection device or any other electrical device, are physically arranged by selection of size, shape, lead length and spatial orientation relative to each other to provide the desired impedance versus frequency characteristics for successful noise suppression over a specified frequency band. This can be accomplished, for example, in the case of a transient overvoltage protection device, by selecting the particular diodes required for the particular transient protection task and, using a noise spectrum generator, physically arranging and rearranging the packaging of the diodes in terms of their physical orientation and spacing relative to each other, including the length and position of leads, until the desired noise frequencies are eliminated from the output spectrum. In this regard, by adjusting the lumped parameters of the package through physical orientation of the components, the resonant frequency and effective bandwidth about that frequency can be selectively defined and made to fit the desired noise suppression characteristics for a particular application.

Hence, the system of the present invention adds a new dimension of flexibility, in terms of noise suppression, in an age of increasingly sensitive electronic systems requiring such protection.

The foregoing and other objects and advantages of the invention will become apparent from the following more detailed description, when taken in conjunction with the accompanying drawings of illustrative embodiments.

DESCRIPTION OF THE DRAWINGS

FIG. 1 is a plan view of an electrical package, constructed in accordance with the invention, and including a plurality of series connected diodes;

FIG. 2 is an electrical schematic diagram of the electrical circuitry embodied within the package of FIG. 1;

FIG. 3 is a plan view of another electrical package which may be constructed in accordance with the invention, also including a string of series connected diodes;

FIG. 4 is an electrical schematic diagram of the electrical circuitry within the package of FIG. 3; and FIGS. 5 and 6 are graphical representations of variations in impedance and phase angle with frequency for various electrical devices such as those illustrated in FIGS. 1–4, and further illustrate the features of the invention regarding noise suppression.

DESCRIPTION OF THE PREFERRED EMBODIMENT

Referring now to the drawings, and particularly to FIGS. 1 and 2 thereof, there is shown a new and improved electrical circuit transient protection device 10 which employs a unique internal structural arrangement of electrical components so that, in addition to its normal voltage and/or current suppression functions, the device also filters unwanted noise at frequencies and bandwidths that can be specially selected for each individual application.

While the device 10 in FIGS. 1 and 2 is, for purposes of illustrating the invention, a transient protection device, of the same general types described in U.S. Pat. No. 3,573,550, entitled Automatically Resetting Transient Protection Device, inventor Louis P. Baker, Jr., and U.S. Pat. No. 3,475,653, entitled Electrical Circuit Protector, inventors Richard Odenberg et al., this is by way of example only and not by way of limitation. The transient protection device 10, constructed in accordance with the present invention, is typically connected in an electrical system across the power lines providing electrical input to the protected circuit (not shown).

The transient protection device 10 is usually a self-contained unit having internal characteristics which are selectively determined by the particular internal electrical characteristics and requirements of the electrical circuit to be protected. The particular device 10 shown in FIGS. 1 and 2 includes a plurality of diodes $D_1$ through $D_6$ connected in series between positive and the negative terminals 11, 12. While the diodes $D_1$ through $D_6$ are shown connected in series, they may be also connected in parallel or a combination series and parallel arrangement, depending upon the particular application involved. Similarly, while the diodes in FIG. 2 are illustrated as reverse or Zener diodes, the diodes could also be forward diodes connected in a conventional rectifier configuration.

In accordance with the invention, the lumped parameters for inductance and capacitance of the protection device 10 are varied to eliminate undesired noise frequencies for accomplishing noise suppression. The noise frequencies are typically shunted through the protection device 10 to block the noise from passing to the electrical circuit being protected. In this regard, the electrical components, i.e., diodes $D_1$ through $D_6$, are selected as to size, shape and electrical characteristics suitable for performing their transient protection function, and are then physically arranged in terms of lead length and spatial orientation relative to each other, to provide the desired impedance versus frequency characteristics for successful noise suppression over a specified frequency band.

This is accomplished, for example, in the case of a transient over-voltage protection device, by selecting the particular diodes required for the particular transient protection task, and, using a noise spectrum generator, physically arranging and rearranging the spatial array, i.e., the physical positions and spacing of the diodes relative to each other, including the length and position of leads, until the desired noise frequencies are eliminated from the output spectrum observed on an oscilloscope or other appropriate analyzing device. In this regard, by adjusting the lumped circuit parameters of the device 10 through physical orientation of the components, the resonant frequency and effective bandwidth about that frequency can be selectively defined and made to fit the desired noise suppression characteristics for a particular application.

FIGS. 3 and 4 illustrate a transient protection device 13, similar to the protection device 10 previously described and illustrated in FIGS. 1 and 2, and differs primarily only in the physical orientation of the diodes $D_1$–$D_6$ within the electrical package defining the device 13. The device 13 is also intended to be connected across the electrical circuitry to be protected at terminals 14, 15.

FIGS. 5 and 6 are graphical representations, illustrating the variations in impedance and phase angle with frequency, for the transient protection device 10 and 13 illustrated in FIGS. 1 through 4 of the drawings.

It will be noted in FIG. 5 that the phase angle $O_2$ and impedance $Z_2$ characteristics for the device 10 of FIGS. 1 and 2 cross at a resonant frequency $f_2$ of approximately 14.8 megahertz. In FIG. 6, by changing the diodes $D_1$–$D_6$ and/or their physical orientation, the resonant frequency $f_2$ has shifted upward to approximately 18.0 megahertz. In contrast, the device 13 of FIGS. 3 and 4 has a resonant frequency $f_4$, in FIG. 5, of approximately 9.65 megahertz and, with different diodes and/or physical orientation, has a resonant frequency, as illustrated in FIG. 6, of approximately 12.54 megahertz.

An even greater contrast occurs in comparing, in FIG. 5, the packaging of the electrical device 10 of FIG. 1 with the packaging of the electrical device 13 of FIG. 3. FIG. 5 shows that utilization of the device 10, instead of the device 13, shifts the resonant frequency at $f_4$ for noise suppression to the resonant frequency $f_2$ for noise suppression and thereby raises the resonant frequency approximately 53% relative to $f_4$. Similarly, FIG. 6 illustrates an increase in resonant frequency from $f_4$ to $f_2$ of approximately 43.5%.

The graphical representations of FIGS. 5 and 6 were obtained for electrical devices 10 and 13 with the physical dimensions shown (in inches) in FIGS. 1 and 3 of the drawings. FIG. 5 was obtained using type SICTE 5, 6 volt diodes, manufactured by Semicon, Inc. of Burlington, Mass., and FIG. 6 was obtained using type 1.5SE13A, 13 volt diodes, manufactured by Semicon, Inc. In general, a more closed physical configuration tends to reduce the resonant frequency of the electrical package, while a more open configuration tends to increase the resonant frequency of the package.

The devices of FIGS. 1–4 and corresponding graphical representations of FIGS. 5 and 6 are, of course, only for purposes of illustration, and a wide range of noise suppression characteristics can be provided, in accordance with the invention, by selecting different electrical components and changing their physical orientations relative to each other to selectively alter the lumped parameters of the particular electrical package. In this way, the resonant frequency and effective bandwidth about that frequency are selectively defined and suited to the particular application involved. Accordingly, the system of the present invention provides extensive flexibility and satisfied a long existing need in the electrical arts, in terms of the capability for selectively tailoring the noise suppression characteristics of electrical packages.

It will be apparent from the foregoing that, while particular forms of the invention have been illustrated and described, various modifications can be made without departing from the spirit and scope of the invention. Accordingly it is not intended that the invention we limited, except as by the appended claims.

We claim:

1. A device for protecting electrical circuitry from electrical transients, said device comprising:
   a plurality of diodes connected between a pair of electrical terminals, the physical spacing and orientation of said diodes being selected to provide
   a selectively tailored impedance versus frequency characteristic enabling filtering of undesired noise at frequencies selected for individual applications utilizing said device.

2. A device as set forth in claim 1, wherein said diodes are reverse diodes.

3. A device as set forth in claim 1, wherein said diodes are forward diodes.

4. A device as set forth in claim 1, wherein a plurality of said diodes are electrically connected in series.

5. An over-voltage protection device for electrical circuitry, comprising:
   first and second terminals for connection to the power input terminals of a circuit being protected;
   a plurality of electrical components connected between said pair of terminals, the physical spacing and orientation of said components being selectively arranged and rearranged to provide a selectively tailored impedance versus frequency characteristic enabling filtering of undesired noise at frequencies selected for individual applications utilizing said device.

6. An over-voltage protection device as set forth in Claim 5, wherein said electrical components include at least one diode.

7. A method used in selectively varying lumped parameters in an electrical package to accomplish noise suppression, including:
locating a plurality of interconnected electrical components in said electrical package; and
spatially orienting by arranging and rearranging said components to provide a selectively tailored impedance versus frequency characteristic enabling filtering of undesired noise at frequencies selected for individual applications utilizing said method.

8. A method as set forth in claim 7, wherein said spatially orienting step includes:
varying component size.

9. A method as set forth in claim 7, wherein said spatially orienting step includes:
varying electrical lead length.

10. A method as set forth in claim 7, wherein said spatially orienting step includes:
varying spacing between components.

11. A method as set forth in claim 7, wherein said spatially orienting step includes:
varying physical orientation of components relative to one another.

* * * * *